United States Patent
Fan et al.

(10) Patent No.: US 6,892,668 B2
(45) Date of Patent: May 17, 2005

(54) APPARATUS FOR FORMING A PHOTOSENSITIVE ELEMENT HAVING A LAYER OF PARTICULATE MATERIAL

(75) Inventors: Roxy Ni Fan, Warren, NJ (US); William John Hommes, Hockessin, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 5 days.

(21) Appl. No.: 10/780,390

(22) Filed: Feb. 17, 2004

(65) Prior Publication Data

US 2004/0159404 A1 Aug. 19, 2004

Related U.S. Application Data

(62) Division of application No. 10/262,768, filed on Oct. 2, 2002, now Pat. No. 6,777,163.

(51) Int. Cl.[7] .................................................. B05C 1/08
(52) U.S. Cl. ..................... 118/46; 118/264; 118/304; 118/407; 118/410
(58) Field of Search ........................... 118/46, 264, 304, 118/407, 410; 101/401.1, 375; 492/56

(56) References Cited

U.S. PATENT DOCUMENTS

| | | | |
|---|---|---|---|
| 3,980,047 A | 9/1976 | Cohen et al. | |
| 4,069,791 A | 1/1978 | Tobias | |
| 4,229,518 A | 10/1980 | Gray et al. | |
| 4,414,916 A | 11/1983 | Martin | |
| 4,425,867 A | 1/1984 | Tobias | |
| 4,427,759 A | 1/1984 | Gruetzmacher et al. | |
| 4,622,088 A | 11/1986 | Min | |
| 4,871,650 A | 10/1989 | Wallbillich et al. | |
| 4,883,742 A | 11/1989 | Wallbillich et al. | |
| 5,798,019 A | 8/1998 | Cushner et al. | |
| 5,888,697 A | 3/1999 | Fan | |
| 5,888,701 A | 3/1999 | Fan | |
| 5,916,403 A | 6/1999 | Cushner et al. | |
| 6,576,075 B1 * | 6/2003 | Hartman et al. | 156/78 |
| 6,742,453 B1 * | 6/2004 | Borski | 101/401.1 |
| 6,769,363 B2 * | 8/2004 | Vrotacoe et al. | 101/401.1 |

FOREIGN PATENT DOCUMENTS

| | | |
|---|---|---|
| DE | 2844426 C2 | 9/1979 |
| EP | 0469375 A2 | 2/1919 |
| GB | 1579817 | 11/1980 |

* cited by examiner

*Primary Examiner*—Laura Edwards
(74) *Attorney, Agent, or Firm*—Thomas H. Magee

(57) ABSTRACT

The invention relates to a process and apparatus for forming a photopolymerizable element useful as a flexographic printing plate having at least one layer of particulate material. The process includes forming a layer of a molten photopolymerizable material onto a support; and applying the particulate material onto an exterior surface of the photopolymerizable layer opposite the support within 48 hours of forming the layer of photopolymerizable material. The process optionally includes heating of the surface of the photopolymerizable layer.

29 Claims, 3 Drawing Sheets

APPARATUS FOR FORMING A PHOTOSENSITIVE ELEMENT HAVING A LAYER OF PARTICULATE MATERIAL

This application is a divisional application of U.S. Ser. No. 10/262,768 filed Oct. 2, 2002, now U.S. Pat. No. 6,777,163.

BACKGROUND OF THE INVENTION

1. Field of the Invention

This invention pertains to a process for forming a photosensitive element having particulate material on a layer of photopolymerizable material. The invention also relates to an apparatus for applying the particulate material onto the photopolymerizable layer. The particulate material may be applied to the photosensitive element that is in sheet form, a web or a cylindrically-shaped form. In particular, the method and the apparatus apply particulate material onto the photopolymerizable layer of a cylindrically-shaped photosensitive printing element suitable for use in flexographic printing.

2. Description of Related Art

Photopolymerizable material can be formed into sheets or layers by several known methods such as solvent casting, hot pressing, calendering and extrusion. The photopolymerizable material generally comprises an elastomeric binder, at least one monomer and a photoinitiator. A preferred method of forming photopolymerizable material for use in a flexographic printing element is by extrusion calendering the photopolymerizable material. In extrusion calendering, the printing element is prepared by passing a mass of hot photopolymerizable material into an extrusion die that forms a layer, passing the layer into the nip of a calender and, while still hot, calendering the photopolymerizable material between two flat surfaces, generally two flexible films, to form a multilayer web. The printing element as a multilayer web can be cut into suitable size sheets. Extrusion and calendering of photopolymeric compositions are disclosed, for example, in Gruetzmacher et al., U.S. Pat. No. 4,427,759; and in Min, U.S. Pat. No. 4,622,088.

Although a photosensitive printing element is typically used in sheet form, there are particular applications and advantages to using the printing element in a continuous cylindrical form. A continuous printing element has applications in the flexographic printing of continuous designs used in wallpaper, decoration and gift wrapping paper, and tight-fit conditions for registration, since the designs can be easily printed without print-through of the plate seam. Furthermore, such a continuous printing element is well-suited for mounting on laser exposure equipment where it can replace the drum or be mounted on the drum for exposure by a laser to achieve precise registration.

The formation of a seamless, continuous printing element can be accomplished by several methods. The photopolymerizable flat sheet element can be reprocessed by wrapping the element around a cylindrical form, usually a printing sleeve or the printing cylinder itself, and fusing or joining the edges together to form a seamless, continuous element. Processes for joining the edges of a plate into a cylindrical form have been disclosed, for example, in German patent DE 28 44 426, United Kingdom patent GB 1 579 817, European patent application EP 0 469 375, U.S. Pat. No. 4,883,742, and U.S. Pat. No. 4,871,650. A problem with the prior methods of joining the edges to form the continuous cylinder is that the results of printing with the joined edge element are often unsatisfactory, particularly when the joined edge falls within the effective printing area of the plate. Although the prior art often describes the so-formed continuous element as "seamless", the joined seam has not completely formed a continuum of the photopolymerizable layer at the edges since the joined seam is visible in and interrupts the printed image.

U.S. Pat. Nos. 5,798,019 and 5,916,403 disclose an apparatus and a process for forming a cylindrical photosensitive element of uniform thickness on a flexible sleeve without sanding, grinding or additional polishing steps. The method involves supplying a stream of molten photopolymerizable material onto the sleeve supported directly on a mandrel, calendering the molten photopolymerizable material to have a substantially constant thickness on the sleeve, moving the sleeve around and along the mandrel in a helical fashion to polish an outer surface of the element, and during the calendering step, heating the photopolymerizable material.

A flexographic printing form is made from a sheet or cylindrical photosensitive element by imagewise exposing the element to actinic radiation to selectively polymerize the photopolymerizable layer, and treating the element with a suitable solvent or heat to remove the unexposed areas of the photopolymerizable layer, thereby leaving a printing relief which can be used for printing.

Imagewise exposure of a photosensitive element requires the use of a mask having transparent and opaque areas covering the photopolymerizable layer. The mask may be a phototool that is a photographic negative of the desired printing image. In some applications, it is desirable to eliminate the phototool by directly recording information on the photosensitive element, e.g., by means of a laser beam. In particular, digitized imaging without a phototool is well-suited for making a seamless, continuous printing form. The image to be developed could be translated into digital information, and the digital information used to place the laser for imaging to form an in-situ mask on the photopolymerizable layer.

U.S. Pat. Nos. 5,888,697 and 5,888,701 disclose a photosensitive printing element having an overall layer of powder material and a process for making a flexographic printing form from such an element. The photosensitive element includes a support, a photopolymerizable layer, and a layer of powder material on the photopolymerizable layer. The is powder material may be opaque or transparent depending upon desired use. Typically the surface of the photopolymerizable layer is inherently tacky due to the elastomeric binder and/or migratory compounds such as monomer and plasticizer present in the photopolymerizable layer. Due to the tackiness of the photopolymerizable layer, the powder material adheres to the exterior surface of the photopolymerizable layer, preferably to form an overall layer of particulate material on the element. The particulate layer can function as a release layer, a masking layer such as an infrared-sensitive layer for forming an in-situ mask, or can function to alter the surface characteristics of the photopolymerizable layer.

Apparatuses for automatically applying particulate material, such as toner, onto a tacky surface are known. The tacky surface is provided by a sheet-like photosensitive element, typically a pre-press proof form, which has been imagewise exposed to form nontacky areas and tacky areas on the surface. Examples of automatic toning apparatuses are disclosed by Cohen et al. in U.S. Pat. No. 3,980,047; Tobias in U.S. Pat. Nos. 4,069,791 and 4,425,867; and Martin in U.S. Pat. No. 4,414,916. Generally, the apparatus includes a hopper for supplying and dispensing the toner onto an applicator that transfers the toner to the tacky surface. The applicator typically is a brush pad that can oscillate laterally of the direction of movement of the tacky surface. Martin in U.S. Pat. No. 4,414,916 also discloses that the photosensitive element can be heated prior to toning to enhance the tackiness of the exposed latent image on the surface. Although the use of automatic toning apparatuses generally improve the coverage of the toner on the tacky surface over hand application of the toner, nonuniformity of the toner layer, observed as bands or lanes of high density areas and/or low density area, may occur along the direction of movement of the element.

A problem associated with applying particulate material to the photopolymerizable layer is that it may take multiple applications of particulate material to thoroughly cover to a substantially uniform state the exterior surface of the photopolymerizable layer. Generally, it is desirable to have the particulate material as an overall layer so that the surface tackiness of the photopolymerizable layer is reduced or eliminated. If the particulate material is transparent, such an overall layer may function as the release layer. If the particulate material is opaque and is used to form an in-situ mask, overall coverage of the element is necessary to attain the density of the layer of particulate on the photopolymerizable layer in order is for the opaque layer to block actinic radiation to the photopolymerizable layer. In addition to multiple applications, each application of particulate material may take extended periods of time to adhere the particulate to the tacky surface.

Another problem associated with applying particulate material to the photopolymerizable layer is that because the photopolymerizable layer is so inherently tacky, air borne contaminates may first adhere to the surface of the photopolymerizable layer prior to the application of the particulate material. As such, the particulate material does not adhere to the photopolymerizable layer where contaminates are located and a non-uniform layer of particulate material results. The non-uniformity caused by contaminates creates pinholes in the layer. Pinholes are problematic particularly when the particulate layer is opaque and blocks the underlying photopolymerizable layer from actinic radiation during imagewise exposure. Pinholes allow radiation to expose the underlying photopolymerizable layer. This pinhole exposure causes print through and undesirable specks on the floor of the processed printing element which result in background printing on press.

Thus, the problem is to achieve the desired quality and density of the layer of particulate material on the photopolymerizable layer while maintaining productivity and low cost of the process to prepare a photosensitive printing element.

SUMMARY OF THE INVENTION

It is an object of the present invention to provide a process and apparatus for applying particulate material to a photopolymerizable layer wherein the particulate material forms a layer that is substantially uniform covering of the photopolymerizable layer in minimal number of applications and in minimal time.

In accordance with this invention there is provided a process for forming a photosensitive element useful as a flexographic printing form having at least one layer of particulate material. The process comprises forming a layer of molten photopolymerizable material onto a support, and applying the particulate material onto an exterior surface of the photopolymerizable layer opposite the support within 48 hours of forming the layer of photopolymerizable material. In accordance with another aspect of this invention, the particulate material is applied onto an exterior surface of the photopolymerizable layer opposite the support within 48 hours of forming the layer of photopolymerizable material and when the surface of photopolymerizable layer has a temperature greater than 30° C.

In accordance with yet another aspect of this invention there is provided an apparatus for forming a photosensitive element useful as a flexographic printing form. The apparatus comprises means for forming a layer of molten photopolymerizable material onto a support, means for applying particulate material onto an exterior surface of the photopolymerizable layer opposite the support, and means for providing relative movement between the photopolymerizable layer and the applying means, so that the exterior surface of the photopolymerizable layer has area portions each of which experience the same or substantially the same particulate application conditions.

In accordance with still another aspect of this invention there is provided an apparatus for applying particulate material on a photosensitive element useful as a flexographic printing form. The apparatus comprises means for mounting the photosensitive element having a layer of photopolymerizable material onto a support, means for applying the particulate material onto an exterior surface of the photopolymerizable layer opposite the support, and means for providing relative movement between the photopolymerizable layer and the applying means so that the exterior surface of the photopolymerizable layer has area portions each of which experience the same or substantially the same particulate application conditions.

DESCRIPTION OF THE PREFERRED EMBODIMENT(S)

Figure 1:
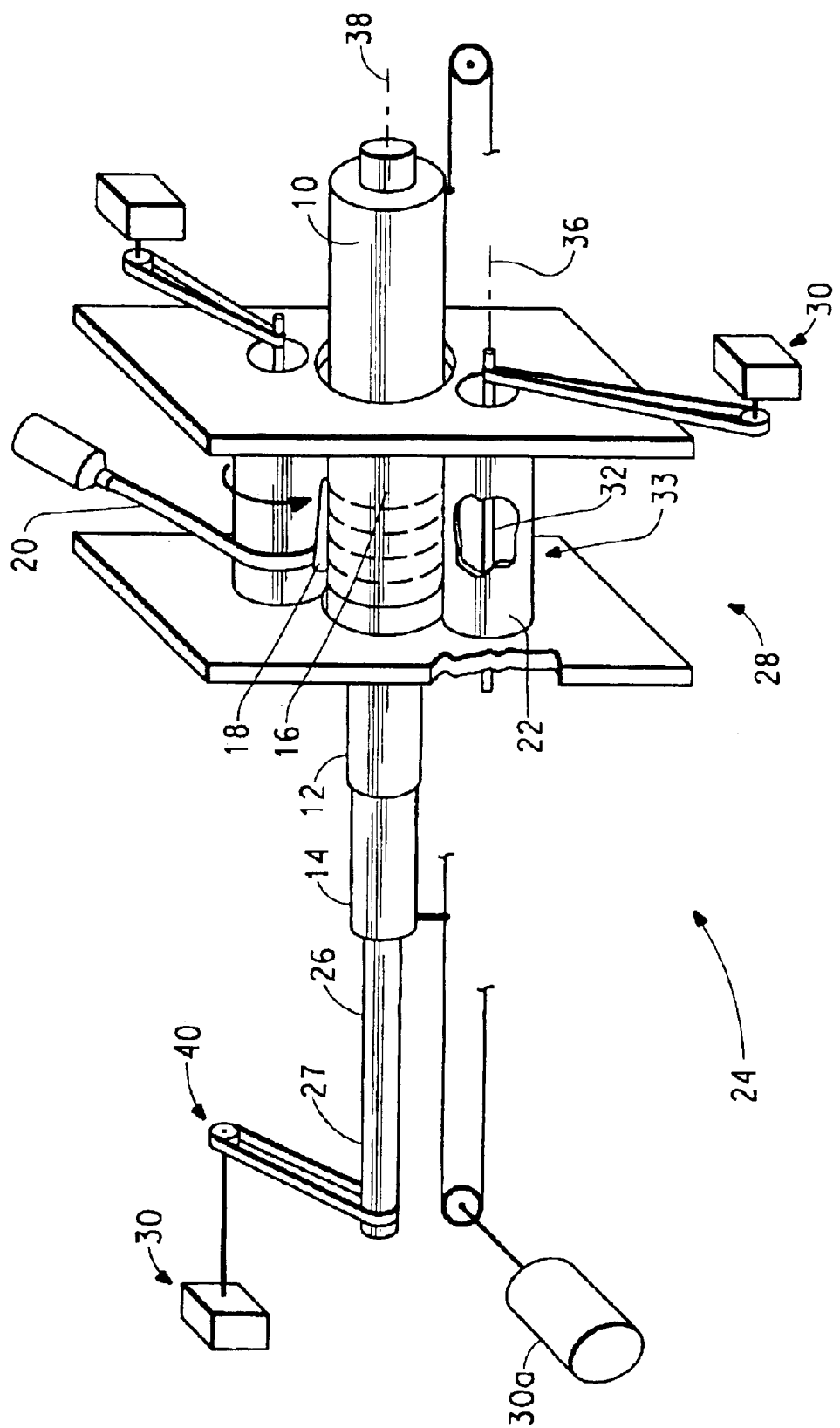
FIG. 1 is a diagrammatic perspective view of an apparatus for forming a photopolymerizable layer on a cylindrical support.

Throughout the following detailed description, similar reference characters refer to similar elements in all figures of the drawings.

The present invention provides a process and an apparatus for forming a photosensitive element useful as a flexographic printing form. The photosensitive element comprises, in order, a support, at least one layer of photopolymerizable material, and at least one layer of particulate material on the photopolymerizable layer. The layer of particulate material will typically completely cover an exterior surface of the photopolymerizable layer opposite the support or at least an imageable portion of the surface of the photopolymerizable layer.

The layer of particulate material has improved quality and density on the element when the particulate material is applied on the surface within 48 hours of forming the layer of photopolymerizable material. It is particularly advantageous to apply the particulate material within 48 hours of forming the photopolymerizable layer from a molten state of the photopolymerizable material. The photopolymerizable layer may be at an elevated temperature as a result of the molten state of the material (from forming) when applying the particulate layer. Alternatively, the surface of the photosensitive element may cool or be cooled prior to, during, or after the application of the particulate material. Preferably, the surface of the photopolymerizable layer is at least 30° C. when the particulate material is applied.

The layer of particulate material can function in various capacities for the element. The particulate layer can be a layer of powder material on the photopolymerizable layer that functions as a release layer, providing the element with a tack-free surface and enabling good vacuum drawdown and easy removal of a phototool film after imagewise exposure of the element. If the layer of particulate material absorbs laser radiation and is opaque to actinic light, the layer can be imagewise removed by laser radiation to form an in-situ mask on the element. In addition, the layer of particulate material can alter the surface characteristics of the photopolymerizable layer and provide, for example, a roughened surface on the element and alter ink pickup or ink release characteristics of the printing form. A photopolymerizable layer having a roughened surface can eliminate the need for a phototool to have a matte surface.

Process and Apparatus

The first step of the present invention is forming a photopolymerizable layer on a support. The method of forming the layer of photopolymerizable material on the support is not limited. Conventional methods for forming the photopolymerizable layer from photopolymerizable material, for example, by solvent casting, hot pressing, and extrusion and calendering, are suitable. For hot pressing, the photopolymerizable material can be placed between the support and a temporary coversheet in a mold, and the layers of material are then pressed flat by the application of heat and/or pressure. It is preferred that the photopolymerizable material be formed into a layer by extruding the material as a hot melt and calendering to meter to a substantially uniform layer of desired thickness. Depending upon the photopolymerizable material used, the molten photopolymerizable material is typically supplied at a temperature in a range of about 90° C. to about 180° C. It is also contemplated that instead of supplying the photopolymerizable material from an extruder, the photopolymerizable material can be precompounded, heated to a melt, and supplied by a delivery device at a uniform rate to the support. The photopolymerizable layer may be formed onto a support of any shape including web, sheet, or cylindrical.

When the photopolymerizable layer is formed by extrusion calendering on a web support, the photopolymerizable element is prepared by extruding the molten photopolymerizable material into a layer, passing the layer into the nip of a calender and, calendering the molten photopolymerizable material between the support and a flexible film to a layer of uniform thickness. Exemplary processes for forming photopolymerizable layers on a web are disclosed by Gruetzmacher et al., in U.S. Pat. No. 4,427,759; and by Min, in U.S. Pat. No. 4,622,088. The flexible film can include multiple layers or compound films. A film bearing a thin layer of flexible polymeric film is an example of a compound film. The flexible film (but not necessarily the multiple layers) will need to be removed prior to the application of particulate material.

When the photopolymerizable layer is formed by extrusion calendering on a cylindrically-shaped support, the cylindrical support resides on a roll or is supported such that the cylindrical support and at least one calender roll form a nip. The cylindrical photopolymerizable element is prepared by extruding the molten photopolymerizable material into a layer or a stream, passing the molten material into the nip of the calender, and calendering the photopolymerizable material between the cylindrical support and at least one calender roll to a layer of uniform or substantially uniform thickness. While calendering, the cylindrical support rotates or is rotated to polish an outer circumferential surface of the photopolymerizable material to a seamless uniform or substantially uniform state to form a seamless cylindrical photopolymerizable layer on the support. It is preferred that the outer surface of the photopolymerizable material is polished to a uniform state during calendering such that sanding, grinding or additional polishing steps are not necessary to form the seamless cylindrical photopolymerizable layer on the support. But such sanding, grinding or additional polishing steps are acceptable to form the photopolymerizable layer of desired uniformity or characteristics. The photopolymerizable layer is seamless in that the layer is a continuum of photopolymeric material formed from a hot melt of polymer. Processes particularly suitable for forming the photopolymerizable layer on a cylindrical support are disclosed by Cushner et al. in U.S. Pat. Nos. 5,798,019 and 6,916,403 and in European publication EP 1076263 A1.

The photopolymerizable layer may also be formed on the support by placing a preformed planar photopolymerizable layer on a cylindrical support and heating the layer to a molten state sufficient to fuse mating edges of the layer together and form a continuous cylindrical photopolymerizable layer on the support. Alternatively, the photopolymerizable layer may be formed on the cylindrical support by placing the preformed planar photopolymerizable layer on the support, heating the layer to a molten state and calendering to meter to a substantially uniform layer of desired thickness. Hereto, additional steps of sanding, grinding, or polishing may be necessary to assure desired uniformity and characteristics of the photopolymerizable layer. Other processes suitable for forming the photopolymerizable layer on the support are disclosed by Zuerger et al. in EP 440 079 A and by Arimatsu in U.S. Pat. No. 4,337,220.

The photopolymerizable element may undergo one or more additional steps to include one or more layers on the photopolymerizable layer, prior to the application of particulate material. The element may include additional layers conventional in the art on the photopolymerizable layer, such as, for example, a capping layer as disclosed by Gruetzmacher et al., in U.S. Pat. Nos. 4,427,759 and 4,460,675.

The next step of the present invention is applying particulate material onto an exterior surface of the photopolymerizable layer opposite the support. This step must be conducted within 48 hours of the formation of the photopolymerizable layer from molten photopolymeric material in order to take advantage of the improvement in covering power and quality of the layer of particulate material. Preferably the particulate material is applied within 24 hours, even more preferably within 16 hours, and most preferably within 2 hours of forming the photopolymerizable layer. The particulate material may be applied immediately (e.g., within several seconds or minutes) after forming the photopolymerizable layer. The exterior surface of the photopolymerizable layer is typically tacky, i.e., sticky or have an oilyness to the touch of the surface of the layer, and as such the particulate material adheres to the surface. Typically the surface of the photopolymerizable layer in flexographic printing elements is inherently tacky due to the elastomeric binder and/or to migratory compounds, such as monomer and plasticizer, in the photopolymerizable layer. Although particulate material will adhere to the tacky surface, this effect is enhanced by application of the particulate within 48 hours of the formation of the photopolymerizable layer while the morphology of the photopolymerizable layer is still fresh.

Surprisingly and unexpectedly, we have found that the desired density, uniformity, and quality of the particulate layer on the element can be greatly enhanced by applying the particulate within 48 hours or less from the formation of the photopolymerizable layer from a molten mass. The density of the particulate layer can be determined optically with a densitometer. Quality problems associated with delayed application of the particulate material (after 48 hours) are typically pinholes. Pinholes are small openings in the covering layer where particulate material did not adhere. When the particulate material is to form an opaque layer on the photopolymerizable element, pinholes in the opaque layer allow actinic radiation to expose (and harden) the underlying photopolymerizable layer resulting in printing in non-printing areas of the printing plate. In such a case, the printed images will appear dirty. Pinhole defects are believed due in part to contamination of the exterior surface of the photopolymerizable layer by airborne particles adhering to the surface before the particulate material. Pinholes may also result from the change in the morphology of the photopolymerizable layer as the photopolymerizable layer ages. The density, quality, and uniformity of the particulate layer are improved by application of the particulate material within 48 hours while the photopolymerizable layer is freshly formed from the molten state, that is, when the morphology of the layer is more likely to accept the particulate material.

In addition, less time is needed to apply the particulate material to the surface of the photopolymerizable layer when the surface of the photopolymerizable layer is at least 30° C. than when the photopolymerizable layer is at ambient conditions. Thus, productivity and costs of the process for making a photopolymerizable printing element are improved by applying the particulate material while the surface temperature of the photopolymerizable layer is above room temperature (generally room temperature is about 20 to 25° C.).

Preferably the application of particulate material occurs when the exterior surface of the photopolymerizable layer is at least 30° C., more preferably 35 to 110° C., and most preferably 40 to 90° C. As such, depending upon the particular embodiment, the temperature of the exterior surface of the photopolymerizable layer may need to be altered, by heating or cooling, to accommodate the preferred temperature for application of the particulate material. If the exterior surface of the photopolymerizable layer is too hot when the particulate is applied, the surface of the photopolymerizable layer can be deformed causing undesirable change to the dimension, particularly thickness of the photopolymerizable layer, of the element. If the exterior surface of the photopolymerizable layer is too cool when the particulate is applied, applying of the particulate material will take a longer time to reach the desired density. The time necessary to apply the particulate material to a desired density depends, in part, upon the temperature of the surface of the photopolymerizable layer as shown in the Examples. Given the same time to apply particulate, the higher the temperature of the surface of the photopolymerizable layer, the higher the density of the particulate layer. Even though improved results are obtained when the temperature of the surface of the photopolymerizable layer is greater than 30° C., the temperature of the photopolymerizable layer should not be so hot so as to cause delamination of the photopolymerizable layer from the support or deformation of the support. If the photopolymerizable layer has just been formed from the molten material, the exterior surface of the photopolymerizable layer may be too hot, that is, greater than about 110° C., for the application of particulate to occur. In this case, it may be necessary to cool the surface of the photopolymerizable layer prior to or during application of the particulate. When there is a delay upto 48 hours between the formation of the photopolymerizable layer and the application of the particulate material, the exterior surface of the photopolymerizable layer may need to be heated to a temperature of at least 30° C. in order to quickly reach the desired density.

Additionally, altering the temperature of the photopolymerizable element from the support side may be necessary in order to assure desired temperature of the exterior surface of the photopolymerizable layer during application of the particulate as well as dimensional stability of the element. It may be necessary to heat and/or cool the photopolymerizable element from the support side depending upon the needs of the process at various steps and the materials used. The photopolymerizable layer on a cylindrical support may be mounted on a sleeve support that is mounted on a mandrel. The sleeve support is capable of controlling temperature of the sleeve and thus, the temperature of the photopolymerizable element can be altered from the support side. Altering the surface temperature of the photopolymerizable layer is independent from altering the temperature of the photopolymerizable layer from the support side. The temperature of the exterior surface of the photopolymerizable layer and the temperature of the support side of the photopolymerizable layer can be controlled sequentially, simultaneously, or combinations thereof. In order to assure no shrinkage or distortion of the cylindrically-shaped photopolymerizable element, the photopolymerizable element having the particulate layer thereon should be cooled to room temperature before removing from the sleeve support or mandrel.

The photopolymerizable element includes a covering or layer of particulate material, preferably powder material and more preferably fine powder, on the exterior surface of the photopolymerizable layer. Throughout the specification, particulate material may also be referred to as particulate, powder, powder material, or toner. Preferably the entire exterior surface of the photopolymerizable layer is covered with the layer of particulate material. The particulate contacts the exterior surface of the photopolymerizable layer. The tackiness of the exterior surface of the photopolymerizable layer assures adherence of the particulate material to the photopolymerizable layer. A layer of particulate material may be formed which completely covers the surface of the photopolymerizable layer and renders the entire exterior surface of the photopolymerizable element non-tacky or substantially non-tacky. Typically the layer of particulate material is a monolayer but can be multiple layers of powder in order render the exterior surface of the photopolymerizable layer tack-free. The particulate material is not normally selectively applied, e.g., imagewise applied, to the exterior surface since the exterior surface is not treated or exposed to selectively create tacky and non-tacky areas. However, the particulate material may be added to an imageable portion of the photopolymerizable layer leaving a portion of the surface of the photopolymerizable layer without a powder covering. Depending upon end-use, the layer of powder material can be transparent or opaque to the radiation which induces photoreaction in the photopolymerizable layer, e.g., actinic radiation.

When the particulate material is applied to the photopolymerizable layer it imparts a dry, non-tacky dry finish to the surface of the photopolymerizable element, i.e., there is no resistance or tackiness over time to the touch. The particulate material can be applied to the exterior surface by hand dusting techniques as described in U.S. Pat. Nos. 3,060,024 and 3,620,726; or by mechanical means such as applicators described for example in U.S. Pat. Nos. 3,980,047; 4,019,821; 4,087,279; and 4,069,791; or by an apparatus or assembly for applying the layer of particulate material as described in the present application. Hand and automatic application of powder materials, in particular toners, is also described in "DuPont Proofing System Manual", in the section on making Cromalin® proofs, distributed by DuPont. Hand application is usually accomplished by dipping a pad of tufted material into a tray containing the powder material, applying the powder material in excess and wiping the pad over the entire tacky surface of the photosensitive element. The powder material adheres to the photopolymerizable layer and reduces the tackiness of the layer. Excess material is then wiped off. Application of powder material in excess and wiping over the entire tacky surface of the element is considered one toning cycle.

The application of powder material within 48 hours of formation of the photopolymerizable layer generally provides the desired density, quality, and uniformity of the particulate layer on the element. It is preferred that the desired density, quality and uniformity of the particulate layer is accomplished in one toning cycle. However, additional toning cycles with particulate material may be necessary to assure complete coverage of the entire surface of the element. The additional toning cycles can be applied by hand or mechanical means. The particulate material may be the same or different from the particulate material applied in the first (or previous) toning cycles. The particulate material can also be applied to the exterior surface of a photopolymerizable layer which is cylindrically-shaped by an apparatus described as follows in the present application.

Generally, no additional steps after the application of powder material, such as heating or pressure or exposure to light, is needed to assure adherence of the layer of powder material to the photopolymerizable layer. Generally, the tackiness or lack of tackiness of the powder material layer will be apparent relatively quickly, i.e., immediately, after application of the particulate material onto the photopolymerizable layer.

An apparatus for forming the photopolymerizable element may include an apparatus or assembly for forming the layer of photopolymerizable material and an apparatus or assembly for applying the layer of particulate material. The apparatus for applying the particulate material may be coupled to or decoupled from (independent of) the apparatus for forming the layer of photopolymerizable material.

Apparatuses particularly suitable for forming the photopolymerizable layer on a cylindrically-shaped support are disclosed in U.S. Pat. Nos. 5,798,019 and 6,916,403, and in European publication EP 1076263 A1. U.S. Pat. Nos. 5,798,019 and 6,916,403 disclose an apparatus and a process for forming a cylindrical photosensitive element of uniform thickness on a flexible sleeve without sanding, grinding or additional polishing steps. The process involves supplying a stream of molten photopolymerizable material onto the sleeve supported directly on a mandrel, calendering the molten photopolymerizable material to have a substantially constant thickness on the sleeve, moving the sleeve around and along the mandrel in a helical fashion to polish an outer surface of the element, and during the calendering step, heating the photopolymerizable material. In a first mode, the flexible sleeve is mounted on an air lubricated mandrel such that the air permits the rotational and axial movement of the flexible sleeve with preferably at least two calender rolls positioned around the sleeve at a predefined clearance approximately equal to the desired thickness of the photopolymerizable material on the sleeve. The stream of molten photopolymerizable material is fed into a gap between the sleeve and a calender roll. Once there is coverage of the photopolymerizable material around the circumference of the sleeve, the contact of the photopolymerizable material with the calender rolls will rotate the sleeve. At the same time, the sleeve is pushed laterally along the mandrel causing the polymerizable material to be wrapped spirally around the sleeve.

EP 1076263 A1 discloses a method for forming a seamless cylindrical photosensitive element on a flexible cylindrical sleeve wherein the flexible sleeve is mounted onto a sleeve support to isolate the flexible sleeve from air pressure or other means of lubrication that is used at an interface between the sleeve and the mandrel. The presence of the sleeve support between the sleeve and the mandrel prevents the shrinkage of the sleeve caused by the high temperature of the molten photopolymerizable material. The sleeve support also prevents distortion of the sleeve induced by air lubrication while the sleeve is hot. By separating and isolating the sleeve from the conditions at an outer surface of the mandrel, the sleeve support maintains the sleeve in a substantially cylindrical shape while forming the cylindrical photopolymerizable element. In order to adequately support the sleeve while forming the photopolymerizable layer thereon, the sleeve support is substantially rigid, i.e., does not change dimensionally in use, and thermally stable, that is, does not distort or change shape or size. The sleeve support must be stable to temperatures at least as high as that of the molten photopolymerizable material, that is, stable at least to a temperature of 180° C., and preferably stable to 250° C. The sleeve support can be adapted for mounting on a mandrel.

In the present invention when the support is a cylindrically-shaped sleeve, the sleeve may be mounted directly on the mandrel or onto the sleeve support. In either case, the sleeve or the sleeve support carrying the sleeve is capable of rotating and/or transporting axially while being held in position in the apparatus.

FIG. 1 which is a simplistic schematic view of the apparatus disclosed in U.S. Pat. Nos. 5,798,019 and 6,916,403 except that the sleeve is mounted to a sleeve support as described in EP 1 076 263 A1 is suitable for use in the present invention as the apparatus or assembly for forming a layer of photopolymerizable material on a cylindrically-shaped support. The apparatus 24 comprises a mandrel 26, a calendering assembly 28, a drive system 30 and at least one heating element 32. The mandrel 26 has an outer surface 27 that may be lubricated by air or other fluids. The calendering assembly 28 includes at least one, preferably a plurality of calender roll assemblies 33, each of which include a calender roll 22 having a longitudinal axis 36. The drive system 30, 30a includes a means for moving the sleeve 12 around and along an axis 38 of the mandrel 26 by rotating the calender roll assemblies 33, and an optional mandrel drive mechanism 40 for rotating the mandrel 26. A photopolymerizable element 10 comprised of a layer 16 of photopolymerizable material 18 on the flexible cylindrical sleeve 12 preferably is mounted onto a substantially rigid and thermally stable sleeve support 14. Once mounted, the sleeve 12 and the sleeve support 14 act as a unitary structure during formation of the layer 16 of photopolymerizable material 18 on the sleeve 12. Alternatively, the sleeve 12 could be mounted directly on the mandrel 26 and transported along the mandrel 26 to form the photopolymerizable layer 16 as is disclosed in U.S. Pat. Nos. 5,798,019 and 6,916,403. A substantially molten stream 20 of photopolymerizable material 18 is supplied onto the sleeve 12 and metered to a substantially constant thickness on the sleeve 12, with the use of at least one, preferably two or three, calender rolls 22 positioned around the flexible sleeve 12 at a predefined clearance, approximately equal to the desired thickness of the photopolymerizable material 18.

Although the photopolymerizable material 18 is hot when supplied to the sleeve, the photopolymerizable material may be heated during calendering. One or more of the calender rolls 22 may be heated to heat the photopolymerizable material 18 while the layer of photopolymerizable material is being formed on the sleeve 12. A heating element 32 can be positioned in each of the calender rolls 22. In addition or alternatively, an exterior surface of the one or more of the calender rolls 22 may be heated (not shown). When molten photopolymerizable material 18 is supplied to the flexible sleeve 12, the heating elements 32 heat or maintain the outer surface of the calender rolls 22 at a temperature in the range of 90° C. to 180° C., thereby heating the photopolymerizable material while it is in contact with the calender rolls 22. When a molten stream 18 or sheet is fed into the apparatus, the heating elements 32 heat the outer surface of the calender rolls 22 so as to maintain the photopolymerizable material 18 in a molten or semi-fluid state to permit metering.

The sleeve support 14 can be made of any material or composite which provides the desired rigidity and thermal stability. Preferably, the sleeve support 14 is made of a material with high thermal conductivity to allow quick cooling of the polymer-coated flexible sleeve while on the sleeve support. Preferred materials for the sleeve support 14 are steel or carbon-fiber reinforced resins. The thickness of the sleeve support is the radial difference between the inner circumferential surface and the outer circumferential surface. The thickness of the sleeve support 14 is not particularly critical so long as the sleeve support has the desired rigidity and can securely hold the sleeve 12 with an interference fit. Preferably the thickness of the sleeve support 14 is between 0.098 and 12.7 cm (0.25 and 5.0 inches). The sleeve support 14 has an axial length which is at least as long-as that of the sleeve 12. The axial length of the sleeve support 14 may be the same as or shorter than the axial length of the mandrel 26. Preferably the length of the mandrel 26 is longer than the sleeve support 14 by at least the length of the cylindrical photopolymerizable element 10. Preferably, the sleeve support 14 is positively rotated and is not induced to rotation by the contact of the at least one rotating calender roll 22 with the photopolymerizable material 18 filling in the gap.

The sleeve support 14 may optionally include a means for controlling the temperature of the sleeve support and thereby controlling the temperature of the photopolymerizable layer. To improve the repeatability of the method of forming the cylindrical photopolymerizable element, it is preferred for the temperature of the sleeve support, sleeve, and photopolymerizable material to be repeatable as possible. The means for controlling the temperature of the sleeve support 14 includes one or more passages in an area between its inner circumferential surface and its outer circumferential surface in which a temperature controlling medium, such as air or a liquid, can traverse. The passages as means for controlling the temperature of the sleeve would not open to the outer circumferential surface of the sleeve support 14. At start-up, the temperature controlling medium may be hot to heat the sleeve support 14 to a temperature close to that of the molten photopolymerizable material 18. As the process proceeds, it may be necessary to cool the sleeve support 14 to maintain a consistent temperature at the polymer-coated flexible sleeve 12 while on the sleeve support 14. It is preferred to cool the sleeve support 14 after application of the particulate, thereby cooling the photopolymerizable element to maintain dimensional integrity of the support and element.

Relative axial movement occurs between the sleeve 12 (mounted to the sleeve support 14 or on the mandrel 25) and the supply of photopolymerizable material along a longitudinal axis of the sleeve. In all modes of relative axial movement, both the at least one calender roll 22 and the sleeve 12 rotate, or, both the calender roll 22 and the sleeve support 14 rotate and the sleeve 12 is secured to the sleeve support 14 to move together as a unitary structure. In a first mode, the sleeve 12 or sleeve support 14 moves axially along its longitudinal axis while the supply of photopolymerizable material 18 is axially stationary, i.e., the supply of photopolymerizable material is at a particular location on the sleeve 12. In this mode, the at least one calender roll 22 is axially stationary as well. The sleeve support 14 can be moved axially by the apparatus which is holding the ends of the sleeve 12 or sleeve support 14. Alternately, the sleeve support 14 can move axially along the mandrel 26 at the interface of the outer surface of the mandrel 26 and the inner circumferential surface of the sleeve support 14. In a second mode, the supply of photopolymerizable material 18 moves axially along the longitudinal axis of the sleeve 12 or sleeve support 14 while the sleeve 12 or sleeve support 14 is axially stationary. In this mode, the at least one calender rolls 22 moves axially along the sleeve 12 or sleeve support 14. Relative axial movement of the sleeve 12 or sleeve support 14 (with the supply of photopolymerizable material 18) which is carrying the sleeve 12 while rotating the sleeve 12 or sleeve support 14 provides for forming the cylindrical photopolymerizable element in a helical fashion.

Figure 2:
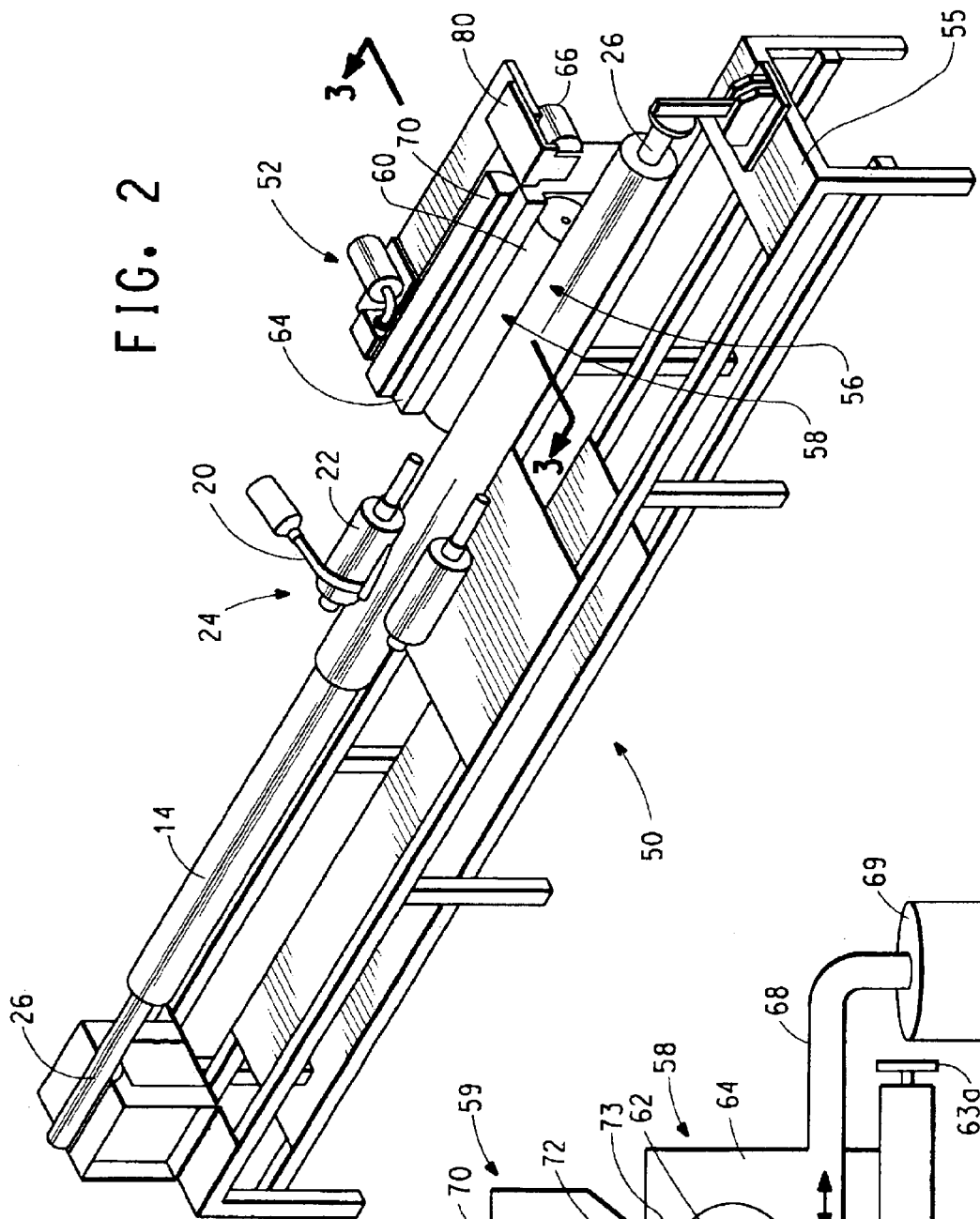
FIG. 2 is a schematic view of an embodiment of an apparatus for forming a photosensitive element having particulate material on an exterior surface of the photopolymerizable layer. The apparatus for forming the element includes the apparatus for forming the photopolymerizable layer on a cylindrical support coupled to an apparatus for applying particulate material to the surface of the photopolymerizable layer.
Figure 3:
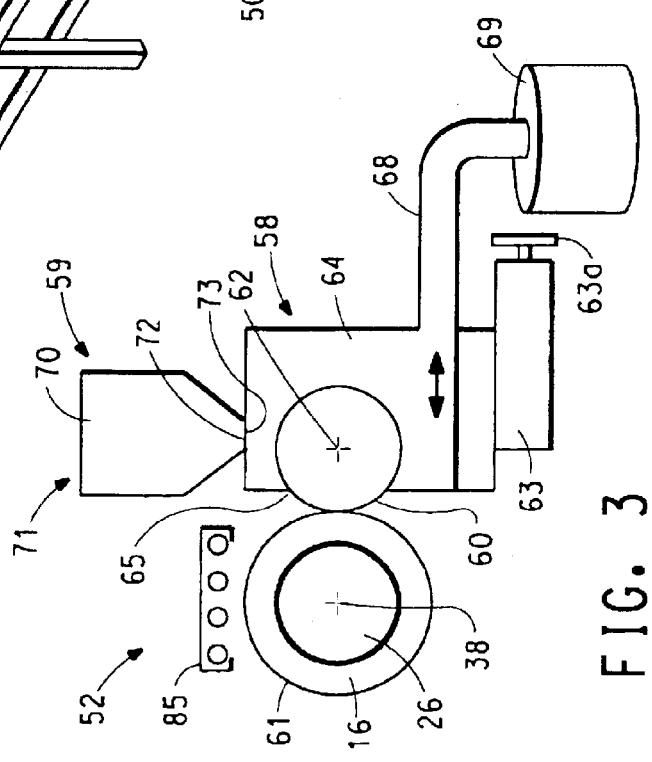
FIG. 3 is a cross-sectional schematic view of the apparatus for applying particulate material shown in FIG. 2 taken along 3—3 line.

FIGS. 2 and 3 depict an embodiment of the present invention of an apparatus 50 for forming a photopolymerizable element, particularly for forming a cylindrically-shaped photopolymerizable printing element 10 having a layer of particulate material thereon. The apparatus 50 includes the apparatus 24 for forming a layer of photopolymerizable material on a cylindrically-shaped support as described above in FIG. 1 and the apparatus 52 for applying a layer of particulate material. Both the apparatus 24 for forming a photopolymerizable layer and the apparatus 52 for applying the particulate are mounted to a frame 55. In the embodiment shown in FIGS. 2 and 3, the apparatus for forming the photopolymerizable layer 24 is coupled to the apparatus 52 for applying particulate material. The two apparatuses 24,52 may be coupled by coupling the mandrel 26 from the forming apparatus 24 to a mandrel associated with the applying apparatus 52. Alternatively, the mandrel 26 of the forming apparatus 24 may be extended beyond the length necessary for forming the photopolymerizable layer on the sleeve 12 in order for the element 10 to transport axially passed an application station 56 of the applying apparatus 52. The drive system 30 from the forming apparatus used to transport the element rotationally and axially along the mandrel 26 can thus be used to transport the element in the same manner passed the applying apparatus. The sleeve 12 or the sleeve support 14 carrying the sleeve 12 thus is rotated and transported axially along the mandrel 26.

The apparatus 52 for applying particulate material is a means for applying particulate material. The means for applying particulate material includes an applicator assembly 58 and a dispensing assembly 59. The applicator assembly 58 includes an applicator pad 60 that brings the particulate material into contact with an exterior surface 61 of the photopolymerizable layer 16. The applicator pad 60 is a resilient, low abrasion, static-controlled, fiber pile, such as, for example, 100% mohair. The fiber pile of the applicator pad 60 is supported with foam backing for providing cushioning effect of the fiber pile upon contact to the photopolymerizable surface 61. The shape of the applicator pad 60 is not limited, but preferably is cylindrically-shaped. The applicator pad 60 has a longitudinal axis 62 that is parallel to the axis 38 of the mandrel 26. The transport of the photopolymerizable element 10 on the mandrel 26 determines the path of the element 10. The applicator pad 60 is axially mounted in a vacuum box 64 having an opening 65 adjacent the path of the photopolymerizable element 10 so that at least the fiber pile of the applicator pad 60 can extend beyond the opening 65. A motor 66 is connected to the applicator assembly 58 to rotate, oscillate, or both rotate and oscillate the applicator pad 60. The vacuum box 64 also includes a conduit 68 and collection chamber 69 for drawing a vacuum to collect extraneous particulate from within the box 64 and minimize particulate from becoming air-borne.

The dispensing assembly 59 includes a trough 70 for holding a supply of particulate material. The trough 70 is positioned above the applicator pad 60 and aligned to the longitudinal axis 62 of the pad 60. The trough 70 includes a first opening 71 for filling the trough with particulate and a second opening 72 for dispensing the particulate from the trough onto the applicator pad 60. The trough 70 is mounted to a topside of the vacuum box 64 so that the second opening 72 of the trough 70 mates with a topside opening 73 in the vacuum box 60, creating a passage for the particulate to dispense onto the applicator pad 60. The trough 60 has interior side walls having multiple distribution members (not shown) which are vibrated by a motor to evenly dispense the particulate without clumping. The width of the gap 72 is narrow enough that the particulate material bridges the gap and does not flow freely unless the multiple distribution members on the side are vibrated.

In this embodiment, the applying apparatus 52 is mounted onto a table assembly 80 supported by the frame 55. The table assembly 80 moves the applying apparatus 52 horizontally, so that the applicator pad 60 can be moved into interference contact with the surface of the photopolymerizable layer 61 as the photopolymerizable element 10 axially passes. The applicator assembly 58 includes a means for adjusting the interference contact of the applicator pad 60 to the surface of the photopolymerizable layer 61. The applying apparatus 52 is mounted on a machine slide 63 which allows the distance between the mandrel axis 38 and applicator pad axis 62 to be adjusted via a hand crank 63a.

Alternatively, the apparatus 24 for forming the photopolymerizable layer and the apparatus 52 for applying the particulate material can be decoupled, or function independent of the other. In this case, the mandrel 26 of the forming apparatus 24 and the mandrel of the applying apparatus 52 are not coupled, or the mandrel 26 of the forming apparatus 24 is not extended beyond that necessary to form the photopolymerizable element 10. In this embodiment, the apparatus 52 for applying particulate material will include a means for axially supporting the cylindrically-shaped support, such as a mandrel or sleeve support, adjacent and parallel to the axis of the applicator pad 60. Additionally, the apparatus 52 in this embodiment will include means for moving the element 10, such as a drive system, to rotate and optionally axially transport the element 10 passed the applicator assembly 58. In this embodiment, the photopolymerizable layer on the support for the photopolymerizable element 10 will be completely formed on the forming apparatus 24 and the element 10 removed from the apparatus. The element 10 may then be either stored (for up to 48 hours) or mounted on the means for supporting of the apparatus 52 for applying particulate material. In a similar manner as that described above for the forming apparatus 24, the photopolymerizable element can be mounted and dismounted directly onto a mandrel or on the sleeve support adapted for mounting in the applying apparatus 52.

The temperature of the exterior surface of the photopolymerizable layer may need to be altered for applying particulate material at the desired temperature of at least 30° C. to about 110° C. When the photopolymerizable layer has just been formed from the molten mass, it may be necessary to cool the exterior surface to less than about 110° C., so that the application of the particulate will not disturb the photopolymerizable layer. Particularly when there is a delay between the application of the particulate material and the formation of the photopolymerizable layer, it may be necessary to heat the exterior surface of the photopolymerizable layer to at least 30° C. The delay typically will occur when the apparatus for forming the photopolymerizable layer and the apparatus for applying the particulate material are decoupled. The photopolymerizable layer may cool too much or even reach ambient conditions temperature (up to 29° C.) due to the delay between the two steps.

The apparatus 52 for applying particulate material may include a means 85 for altering the temperature of the exterior surface 61 of the photopolymerizable layer 16. The means 85 for altering the temperature is mounted to the frame 55. Depending upon the particular embodiment, the means 85 for altering the temperature can be a means for heating or a means for cooling. Heating means can include conduction, convection, radiation, or combinations thereof. A reflector may be included to direct the maximum amount of energy generated by the heating means to the surface of the photopolymerizable layer. The heating means heats the surface of the photopolymerizable layer to greater than 30° C., preferably greater than 35° C., and most preferably 40 to 90° C., just prior to or during the application of particulate material. The means for cooling as a means 85 for altering the temperature can be a blower for passing cool or cooled air (contaminant-free) onto the exterior surface 61 of the photopolymerizable layer 16. In FIG. 3, the means 85 for altering the temperature of the exterior surface 61 of the photopolymerizable layer 16 is depicted as the heating means having radiant heating elements and a reflector. It should be understood by those skilled in the art that any of the means 85 for altering the temperature of the photopolymerizable layer 16 as described above can be positioned as necessary after forming the photopolymerizable layer 16 in order to apply particulate to the photopolymerizable layer 16 at the desired temperature and conditions.

In the applying apparatus 52, it is preferred that relative axial movement occurs between the photopolymerizable layer 16 on the cylindrical support 12 (mounted to the sleeve support 14 or mandrel 26) and the means for applying particulate material along their longitudinal axises. The photopolymerizable layer 16 on the support 12 rotates while relative axial movement occurs. Preferably when the applicator pad 60 is cylindrically-shaped, the applicator pad will rotate as well. Rotation of the photopolymerizable layer 16 on the support 12 and the cylindrical applicator pad 60 are independent of each other in that either can be rotated clockwise or counterclockwise and can be rotated at the same or different rates. In a first mode, the photopolymerizable layer 16 on the support 12 moves axially along its longitudinal axis while the applicator pad 60 carrying particulate material is axially stationary. The photopolymerizable layer 16 on the support 12 can be moved axially by the drive means 30 associated with the forming apparatus 24 when the forming apparatus is coupled to the applying apparatus, or by means for supporting the support and by means for moving in the applying apparatus 52 when the applying apparatus is decoupled from the forming apparatus 24. In a second mode, the applicator pad 60 moves axially along its longitudinal axis while the photopolymerizable layer 16 on the support 12 is axially stationary. Relative axial movement and the rotation of the photopolymerizable layer 16 on the support 12 provides for the exterior surface of the photopolymerizable layer 16 to experience the same or same conditions by the applicator. Uniformity of the layer of particulate material on the photopolymerizable layer is improved by the relative axial movement. If there is no relative axial movement between the applicator 60 and the photopolymerizable layer 16 on the support 12 during application of the particulate material, non-uniformities in the layer of particulate may occur. Oftentimes laning, i.e., areas of high density and low density, of particulate form on the photopolymerizable layer which can result in poor in-situ mask formation (when particulate is opaque) and/or poor relief of the resulting printing plate.

In both the first embodiment where the means 52 for applying particulate is coupled to the means 24 for forming the photopolymerizable layer and in the second embodiment where the means 52 for applying particulate is decoupled from (or independent of) the means 24 for forming the photopolymerizable layer, particular advantages have been found when the entire exterior surface 61 of the photopolymerizable layer 16 experiences the same or substantially the same conditions by the applicator 60. Relative axial movement between the photopolymerizable layer 16 on the sleeve support 12 and the means for applying particulate material along their longitudinal axes assures that each area portion of the entire exterior surface 61 of the photopolymerizable layer 16 is contacted the same or substantially the same by the applicator 60 carrying the particulate material. Such that, each of the area portions of the exterior surface 61 of the photopolymerizable layer 16 experience the same or substantially the same particulate application conditions by contacting all or substantially all of the surface portions of the applicator pad.

Figure 4:
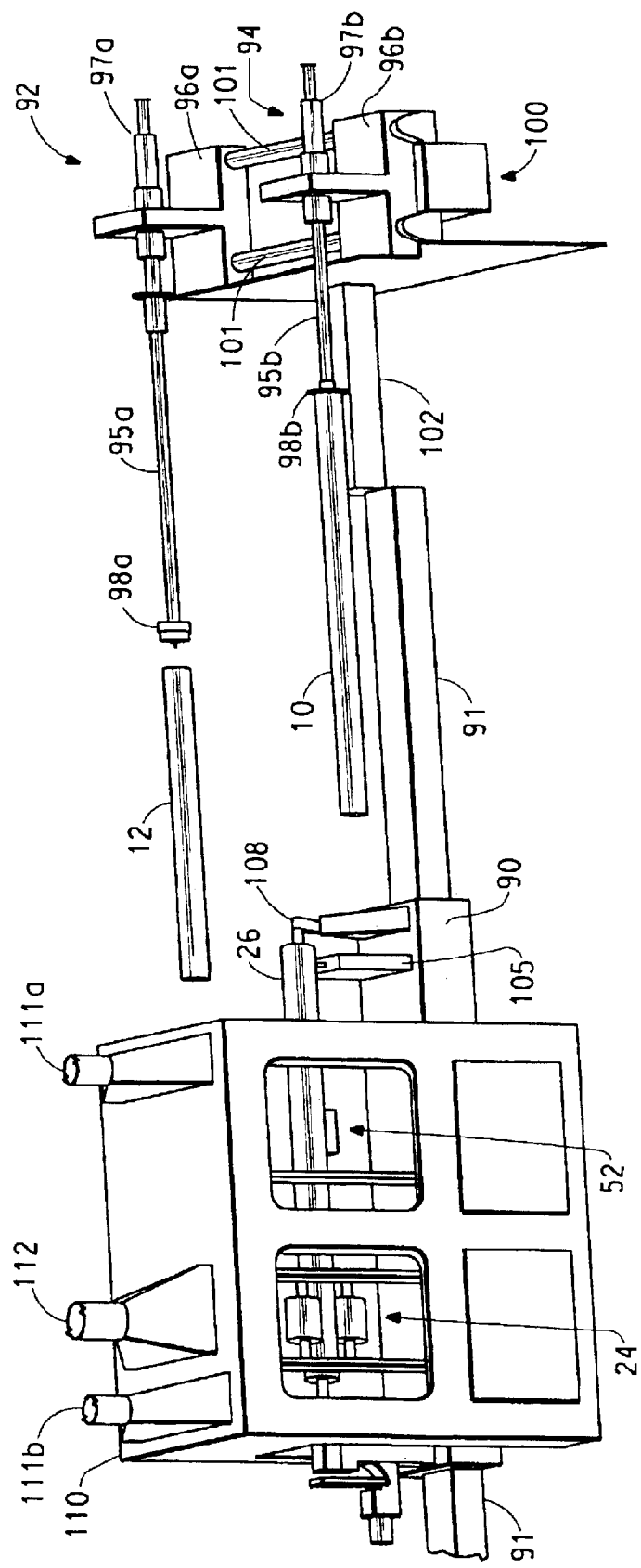
FIG. 4 is an alternate embodiment of the apparatus for forming a photosensitive element having a layer of particulate material thereon, including a sleeve loading assembly and the photosensitive element unloading assembly. The apparatus for forming the element includes the apparatus for forming the photopolymerizable layer on a cylindrical support coupled to an apparatus for applying particulate material to the surface of the photopolymerizable layer.

FIG. 4 is an alternate embodiment of an apparatus for preparing a cylindrically-shaped photopolymerizable element 10 having the particulate layer on the photopolymerizable layer 16. In this embodiment, the means 52 for applying particulate is coupled to the means 24 for forming the photopolymerizable layer so that the advantages of the present invention can be realized. The means 24 for forming the photopolymerizable layer 16 is substantially as described above in FIG. 1. The means 52 for applying particulate layer onto the photopolymerizable layer 16 is substantially as described above in FIGS. 3 and 4. The mandrel 26 is supported at each end by spindles 108 which are mounted to a carriage assembly 90 that can be moved along a rail 91. The carriage assembly 90 carries the mandrel 26 (and the sleeve mounted thereto) past the means 24 for forming the photopolymerizable layer 16 and then past the means 52 for applying the particulate to the outermost surface 61 of the photopolymerizable layer 16, as well as positions the mandrel 26 for loading of the uncoated sleeve 12 and unloading of the formed photopolymerizable element 10.

This embodiment includes a sleeve loading assembly 92 and a sleeve unloading assembly 94 for mounting the sleeve 12 and unmounting the element 10 from the mandrel 26 (or the sleeve support) respectively. The sleeve loading assembly 92 includes a load arm 95a, a support platform 96a for supporting the load arm 95a, and a means 98a for holding the sleeve 12. Means 97a moves the load arm 95a along its axis to extended and retracted positions to engage mandrel 26 during sleeve changes. The load arm 95a includes a gripper 98a (as the means for holding the sleeve 12) at an end opposite the supported end that engages with the end of the sleeve 12, to support the sleeve and move it along the load arm 95a. The end of the load arm 95a opposite the supported end may be shaped to easily engage into the end of the mandrel 26 when the mandrel is unsupported. The means 97a for moving the load arm 95a is not limited, and preferably is a pneumatically-operated piston coupled to the load arm 95a on the support assembly 96a. The sleeve loading assembly 92 and the sleeve unloading assembly 94 are substantially the same, and similar elements are identified with the same reference number. The sleeve unloading assembly 94 includes an unload arm 95b, a support platform 96b for supporting the unload arm 95b, and a means 98b for holding the sleeve 12. Means 97b moves the unload arm 95b along its axis to extended and retracted positions to engage the mandrel 26 during sleeve changes. The unload arm 95b includes a gripper 98b (as the means for hold the sleeve 12) at an end opposite the supported end that engages with an end of the sleeve 12 during the unmounting process. The gripper 98b is moved along the length of the unload arm 95b by means of a linear actuator 102 for loading and unloading sleeves. The end of the unload arm 95b opposite the supported end may be shaped to easily engage into the end of the mandrel 26 when the mandrel is unsupported. The means 97b for moving the unload arm 95b is not limited, and preferably is a pneumatically-operated piston coupled to the unload arm 95b on the support assembly 96b.

The support platform 96a, 96b of each of the loading assembly 92 and the unloading assembly 94 are mounted to a slide assembly 100 so that each assembly 92, 94 can be independently positioned along rails 101 opposite the coupled apparatuses 24, 52 for forming the photopolymerizable layer and applying the particulate layer. Preferably the slide assembly 100 is automated so that the axis of the load arm 95a (and unload arm 95b) can be accurately aligned to the axis of the mandrel 26.

In operation, an uncoated sleeve 12 is loaded onto the load arm 95a and held by the gripper 98a. The gripper 98a and the uncoated sleeve 12 are manually pushed fully onto the load arm 95a. The support platform 96a of the loading assembly 92 moves along the slide assembly 100 to position the axis of the load arm 95a in alignment with the axis of the mandrel 26. When the carriage assembly 90 is moved to the end of slide 91, the mandrel 26 is temporarily supported from below by extending a temporary support 105. The spindle support 108 is then retracted and pivoted clear in preparation for loading the sleeve 12 onto the mandrel 26. Load arm 95a is extended slightly by the means 97a for moving the load arm to engage the end of the load arm 95a to the end of the mandrel 26. The temporary support 105 is retracted. Then the cap 98a and sleeve 12 is lid along the load arm 95a by means of the linear actuator 102. The sleeve 12 is slid onto the air-assisted mandrel 26 as described above. After the sleeve 12 is loaded, the temporary support 105 is extended to support mandrel 26 and the load arm 95a is retracted. The spindle support 113 is then pivoted back into position and the temporary support 105 is retracted. The carriage assembly 90 moves to the left, positioning the end of the mandrel 26 which is closest to the loading assembly 92 in a starting location associated with the means 24 for forming the photopolymerizable layer 16. In the starting position, the sleeve 12 on the mandrel 26 or sleeve support 14 is positioned adjacent to the polymer feed 20. The formation of the photopolymerizable layer 16 by the apparatus 24 for forming the photopolymer layer 16 and the subsequent application of the particulate layer to the outermost surface of the photopolymerizable layer by the apparatus 52 for applying particulate material occurs as described above. During the formation and application steps the carriage assembly 90 moves the mandrel 26 to the right, so that when the photopolymerizable element 10 is completely formed, the mandrel 26 is in an unload position.

The unload assembly 94 operates to remove the formed photopolymerizable element 10 from the mandrel 26 in substantially the reverse manner as the loading assembly 92 operates to load the sleeve 12. The support platform 96b of the unloading assembly moves along the slide assembly 100 to position the axis of the unload arm 95b in alignment with the axis of the mandrel 26. The temporary support 105 is extended to allow the spindle support 108 to be pivoted clear and the unload arm 95b extends so that the end of the unload arm 95b mates with the unjournaled end of the mandrel 26. The temporary support 105 is retracted. The gripper 98b engages the end of the formed photopolymerizable element 10 to slide the element 10 from the air-assisted onto the unload arm 95b by means of the linear actuator 102. The unload arm 95b unmates from the mandrel 26 and the spindle support 108 returns to its normal position. Ends of the photopolymerizable element 10 may be trimmed or cut to axial size at this time.

It is particularly advantageous to have two apparatuses of the embodiment shown in FIG. 4 located side-by-side. In this case, the polymer feed 20 can be diverted to a means 24 for forming the photopolymerizable layer in a first apparatus unit of FIG. 4 while on the companion apparatus unit the photopolymerizable element 10 is unloaded and another uncoated sleeve 12 is loaded. Alternating between the two units making the photopolymerizable element and unloading/loading process is conducive with a continuous polymer process.

The means 24 for forming the photopolymerizable layer and means 52 for applying the particulate layer may be enclosed by a housing 110 for contamination control. The housing 110 may be maintained under positive pressure with clean, filtered air supplies 111a and 111b and have an exhaust air outlet 112.

Materials

The support can be any material that is conventionally used with photosensitive elements used to prepare flexographic printing plates. Preferably the support is transparent to actinic radiation to accommodate "backflash" exposure through the support for building a floor in the photopolymerizable element. Examples of suitable support materials include polymeric films such those formed by addition polymers and linear condensation polymers, transparent foams and fabrics. A preferred support is a polyester film; particularly preferred is polyethylene terephthalate. Under certain end-use conditions metals, such as aluminum, may also be used as a support, even though a metal support is not transparent to radiation. A suitable cylindrically-shaped support is a sleeve. The sleeve provides the cylindrical photopolymerizable element with the capability to be readily mounted and dismounted from a sleeve support as well as from printing cylinders. In order for the element to be readily mounted onto a sleeve support or printing cylinder, the support is capable of expansion and contraction with high pressure air. The support must be able to grip the print cylinder without slippage, i.e., elastically expandable diametrically. The sleeve may be formed from single layer or multiple layers of material. Multiple layered sleeves may include an adhesive layer or tape between the layers of flexible material, reinforcing layers, cushioning layers, etc. Flexible sleeves made of polymeric films are preferred. A suitable multiple layered sleeve is disclosed in U.S. Pat. No. 5,301,610. The sleeve may also be made of actinic radiation blocking materials, such as nickel or glass epoxy. The support typically has a thickness from 0.002 to 0.050 inch (0.0051 to 0.127 cm). A preferred thickness for the sheet form is 0.003 to 0.016 inch (0.0076 to 0.040 cm). The sleeve typically has a wall thickness from 10 to 80 mils (0.025 to 0.203 cm) or more. Preferred wall thickness for the cylindrical support is 10 to 40 mils (0.025 to 0.10 cm).

Optionally, there may be an adhesive layer between the support and the photopolymerizable layer. The adhesive layer on the surface of the support can be a subbing layer of an adhesive material or primer or an anchor layer to give strong adherence between the support and the photopolymerizable layer. Materials suitable as an adhesive layer include thermally activated adhesives, such as hot melt adhesives, and thermoplastic-elastomeric binders. The coating on the support can be 40 angstrom to 40 microns thick. Alternatively, the surface of the support can be treated to promote adhesion between the support and the photopolymerizable layer, with flame-treatment or electron-treatment, e.g., corona-treated. Further, the adhesion of the photosensitive layer to the support can be adjusted by exposing the element to actinic radiation through the support as disclosed by Feinberg et al. in U.S. Pat. No. 5,292,617.

As used herein, the term "photopolymerizable" is intended to encompass systems which are photopolymerizable, photocrosslinkable, or both. The photopolymerizable layer comprises an elastomeric binder, at least one monomer and an initiator, where the initiator has sensitivity to actinic radiation. Throughout this specification actinic light will include ultraviolet radiation and/or visible light. In most cases, the initiator will be sensitive to visible or ultraviolet radiation. Any photopolymerizable compositions which are suitable for the formation of flexographic printing plates can be used in the present invention. The photopolymerizable layer can be soluble, swellable or dispersible in a developer solution, that is, wash out with solvent, semi-aqueous, or an aqueous-based solution, and/or can be capable of partially liquefying upon thermal development, that is, the unpolymerized areas of the photopolymerizable layer soften or melt upon heating to a development temperature (but not be subject to cold flow, i.e., dimensional change, during normal storage). Examples of suitable compositions have been disclosed, for example, in Chen et al., U.S. Pat. No. 4,323,637; Grüetzmacher et al., U.S. Pat. No. 4,427,749; Feinberg et al., U.S. Pat. No. 4,894,315; Martens, U.S. Pat. No. 5,175,072; and Mengel et al. in WO 2001/88615. The composition of the photopolymerizable layer is thus capable of forming a relief suitable for printing.

The elastomeric binder can be a single polymer or mixture of polymers which can be soluble, swellable or dispersible in aqueous, semi-aqueous or organic solvent developers. Binders which are soluble or dispersible in aqueous or semi-aqueous developers have been disclosed in Alles U.S. Pat. No. 3,458,311; Pohl U.S. Pat. No. 4,442,302; Pine U.S. Pat. No. 4,361,640; Inoue et al., U.S. Pat. No. 3,794,494; Proskow U.S. Pat. No. 4,177,074; Proskow U.S. Pat. No. 4,431,723; and Worns U.S. Pat. No. 4,517,279. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers, and isoprene/styrene thermoplastic-elastomeric block copolymers. The block copolymers discussed in Chen U.S. Pat. No. 4,323,636; Heinz et al., U.S. Pat. No. 4,430,417; and Toda et al., U.S. Pat. No. 4,045,231 can be used. The binder can also include core shell microgels and blends of microgels and performed macromolecular polymers, such as those disclosed in Fryd et al., U.S. Pat. No. 4,956,252. It is preferred that the binder be present in at least an amount of 55% by weight of the photosensitive layer.

The photopolymerizable layer can contain a single monomer or mixture of monomers which must be compatible with the binder to the extent that a clear, non-cloudy photosensitive layer is produced. Monomers that can be used in the photopolymerizable layer are well known in the art and include but are not limited to addition-polymerization ethylenically unsaturated compounds having relatively low molecular weights (generally less than about 5000). Examples of such monomers can be found in Chen U.S. Pat. No. 4,323,636; Fryd et al., U.S. Pat. No. 4,753,865; Fryd et al., U.S. Pat. No. 4,726,877; and Feinberg et al., U.S. Pat. No. 4,894,315. It is preferred that the monomer be present in at least an amount of 5% by weight of the photopolymerizable layer.

The photoinitiator can be any single compound or combination of compounds which is sensitive to actinic radiation, generating free radicals which initiate the polymerization of the monomer or monomers without excessive termination. The photoinitiator is generally sensitive to actinic light, and preferably sensitive to ultraviolet radiation. In cases where the layer of particulate material on the photopolymerizable layer is exposed to laser radiation to form an in-situ mask, the photoinitiator must also be insensitive to the laser radiation. Examples of suitable systems have been disclosed in Chen U.S. Pat. No. 4,323,636; Gruetzmacher U.S. Pat. No. 4,460,675; and Feinberg et al., U.S. Pat. No. 4,894,315. Photoinitiators are generally present in amounts from 0.001% to 10.0% based on the weight of the photopolymerizable composition.

The photopolymerizable layer can contain other additives depending on the final properties desired. Such additives include sensitizers, plasticizers, rheology modifiers, thermal polymerization inhibitors, tackifiers, colorants, antioxidants, antiozonants, or fillers.

The thickness of the photopolymerizable layer can vary over a wide range depending upon the type of printing plate desired. The photopolymerizable layer can be from about 0.04 to 0.72 cm (17 to to 285 mils) in thickness or greater.

Particulate material suitable for use in the present invention include the powder materials disclosed by Fan in U.S. Pat. Nos. 5,888,697 and 5,888,701. The particulate material can be organic, inorganic, mixtures of organic and inorganic compounds, or multicomponent. The particulate material can include additives. The particulate material is preferably a fine powder having a wide range of particle sizes. The particulate material can be colorless to form the transparent layer on the photopolymerizable element. Alternately, the particulate material can be colored which includes black, to form the opaque layer on the element. The particulate material after application to the tacky exterior surface of the photopolymerizable layer renders the surface or a portion of the surface tack-free or substantially tack-free.

Colorless particulate material forms a layer on the photopolymerizable element which is transparent or substantially transparent to actinic radiation. A transparent or substantially transparent layer is one which permits all or at least a significant portion of the transmitted amount of actinic radiation to the underlying photopolymerizable layer so that a significant amount of photoinduced reaction occurs in the photopolymerizable layer. The transparent layer of colorless particles can be clear or hazy provided that a significant amount of actinic radiation is transmitted through the layer. The thickness of the layer of colorless powder material is not particularly critical provided that the surface of the element is tack-free at least in the area which is contacted by a phototool after application of the powder.

A transparent layer of particulate material can provide a surface on the element which is comparable to a release surface. In this instance, the powder layer provides a tack-free surface for placement and easy removal of a film, e.g., phototool, from the photopolymerizable element. Also, the transparent layer of powder can modify the surface characteristics, such as, surface roughness, ink pickup and ink release, of the photopolymerizable element. A sufficiently roughened exterior surface of the photopolymerizable element can eliminate the need for matte agent in films which are used as phototools. The matte agent in the phototool assures intimate contact between the phototool and the element upon exposure in vacuum.

Suitable for use as colorless powder material includes, but is not limited to, polyethylene (PE) powders, polytetrafluoroethylene (PTFE) powders, diatomaceous silicas, cellulose acetates, as well as conventional matte agents, such as silica, rice starch, polymethylmethacrylate powders. Other inorganic particles suitable for use includes but is not limited to titanium oxide, zinc oxide, magnesium oxide and alumina.

Particulate material having color includes pigment particles, toner particles, mixtures of pigment particles, mixtures of toner particles and mixtures of pigment and toner particles. Colored powder material forms a layer which is opaque or substantially opaque to actinic radiation. An opaque or substantially opaque layer is one which the amount of actinic radiation transmitted to the underlying photopolymerizable layer is so minuscule that no significant amount of photoinduced reaction occurs in the photopolymerizable layer. The layer of color powder material provides the opacity to block radiation transmitted to the underlying photopolymerizable layer. The color powder layer should also be insensitive to the radiation which induces photoreaction in the photopolymerizable layer, e.g., actinic radiation. The color powder layer on the photopolymerizable element can be ablated by laser radiation. The layer of color powder material on the photopolymerizable element can be imagewise ablated with laser radiation to form an in-situ mask on the element. Since the layer of color powder material can be ablated and can block transmitted radiation, the color powder layer can function similar to a laser radiation sensitive coating layer as disclosed in U.S. Pat. No. 5,262,275. However, unlike the laser radiation sensitive coating layer of U.S. Pat. No. 5,262,275 and related applications, the color powder usually can not be easily removed as a complete or discrete film layer from the photopolymerizable element.

Pigment particles as colored particulate material can be in crystallite form or may be aggregates. Pigment particles suitable for use can be any provided the pigment provides the desired opacity as a layer as well as other desired characteristics. Examples of pigment particles include but is not limited to, Toluidine Red (C.I. Pigment Red 3), Toluidine Yellow (C.I. Pigment Yellow 1), copper phthalocyanine crystals, quinacridone crystals, Toluidine Red YW, Watchung Red BW (C.I. Pigment Red 48), Toluidine Yellow GW (C.I. Pigment Yellow 1), Monastral Blue BW (C. E. Pigment Blue 15), Monastral Green BW (C.I. Pigment Green 7), Pigment Scarlet (C.I. Pigment Red 60), Auric Brown (C.I. Pigment Brown 6), Monastral Green (Pigment Green 7) and Monastral Maroon B and Monastral Orange. Also suitable as pigment particles are carbon black, graphite, copper chromite, chromium oxides and cobalt chrome aluminate; and metals such as aluminum, copper or zinc, and alloys of bismuth, indium, copper, and alloys of copper and zinc.

Toner particles are pigmented organic resin particles which comprise pigment particles finely dispersed in a resin matrix which is then ground to the desired particle size. Pigmented organic resin particles are described in Chu and Manger in U.S. Pat. No. 3,620,726; Vesce in U.S. Pat. No. 2,649,382; and Gray in U.S. Pat. No. 3,909,282 which are hereby incorporated by reference. Pigments suitable for use in the toner particles can be any including those mentioned above, provided the toner provides the desired opacity to the particles as well as other desired characteristics. Suitable resin matrices include, but not limited to, polyvinyl chloride, cellulose acetate, cellulose acetate butyrate, polystyrene, polymethyl methacrylate. Also useful are water soluble polymer matrices, for example, polyvinyl alcohol, methyl cellulose, carboxymethyl cellulose. The particular matrix being used depending on the mechanical means of processing the toner down to the desired effective particle size, desired opacity, and desired ablation sensitivity. Provided that the toners impart the desired characteristics as a powder material on the element, toners suitable for use as the powder layer are not limited and can include toners used for pre-press proofing systems as well as electroconductive toners used in xerographic copy systems. Particularly preferred toners are black toners sold by DuPont as Cromalin® black toners, e.g., Cromalin®type KK6 black toner e.g. a carbon black and cellulose acetate blend.

The color of the particulate material is not particularly critical provided that the color of the powder layer absorbs the laser radiation used to imagewise ablate the layer and the color powder material layer provides desired opacity to the underlying photopolymerizable layer. The material in this layer should be ablatable or removable or transferable (e.g. via a peelable coversheet or via laser exposure through a support) from the photopolymerizable layer such that a mask is formed. If a color powder material is not both sensitive to laser radiation and provides opacity as a layer, then more than one color powder material could be used. For example, one color powder material could be sensitive to the laser radiation and another color powder material could be a radiation-absorbing material, and mixture of which would form the layer on the element. Also, the photoinitiator and other ingredients in the photopolymerizable layer must be insensitive to the laser radiation used to ablate the color powder layer to form the in-situ mask, otherwise some laser radiation will be absorbed by the photopolymerizable layer and the photopolymerizable layer will be ablated or polymerized at the same time especially at higher laser energies. It is within the ordinary skill in the art to appropriately choose laser radiation and a color of powder material combination in which the powder material absorbs the laser radiation and blocks the radiation which induces photoreaction, i.e., initiates photopolymerization, in the photopolymerizable layer, as well as assure that the initiator and other ingredients in the photopolymerizable layer is insensitive to the laser radiation for the desired product and process.

It is preferred to use a color particulate material which is black, such as carbon black or a black toner, when the laser radiation is infrared. The black powder both absorbs the infrared laser radiation and blocks the actinic radiation. As initiators used in the photopolymerizable layer are often sensitive to actinic radiation in the ultraviolet and/or visible region, a layer of black powder is particularly effective in providing UV/visible opacity. The initiator should also be insensitive to the infrared laser radiation.

In addition to providing the working surface of the element tack-free after application (e.g., the imageable portion), the color particulate material layer on the element should be optimized for both sensitivity and opacity to provide high covering power. The layer should be thin enough to provide good sensitivity, i.e., the powder layer should be removed rapidly upon exposure to laser radiation. At the same time the layer should be opaque enough so that the areas of the layer which remain on the photopolymerizable layer after imagewise exposure effectively mask the photopolymerizable layer from actinic radiation. It is preferred that the layer of colored particulate material have a transmission optical density greater than 2.0, so that the layer prevents the transmission of actinic radiation to the photopolymerizable layer.

For the purpose of determining the particle size of the particulate material, particles can be measured for example by a Coulter Counter, Coulter Electronics, Inc. Hialeah Fla. The term particle size as used herein with respect to the powder material covers the size distribution of the smallest, independently acting unit. The size of powder particles suitable for use in this invention is less than 50 microns, and preferably for fine powder particles, the size ranges from 0.01 to 30 micrometers. The particle size of a powder material can be adjusted to achieve desired particle size by for example, milling, and as disclosed in Vesce in U.S. Pat. No. 2,649,382.

Particulate material may be dispersed with wetting aids, surfactants, extenders softeners, and other adjuvants to adjust particle size and to facilitate handling or in the process of use. The surface of powder particles can modified with for example, antistatic agents and slip agents, to provide the particles with desired characteristics. Various types of known antistatic agents are useful for treating and coating the surface of the particles. Useful antistatic agents include anionic, cationic, amphoteric, and nonionic antistatic agents. Slip agents which are useful for treating and coating the particulate toner surface in cooperation with the above described antistatic agents include silicone oil having a weight average molecular weight of 230 to 50000, saturated hydrocarbons having a weight average molecular weight of about 200 to 10000, and fluorocarbon compounds having a weight average molecular weight of 500 to 500000. Additives can be included to the powder material to improve covering power and uniform application of the powder material as a layer.

Unless otherwise indicated, the terms "flexographic printing plate" or "flexographic printing element" or "photopolymerizable printing element" encompass plates or elements in any form suitable for flexographic printing, including, but not limited to, flat sheets and seamless continuous forms. Continuous printing relief forms have applications in the flexographic printing of continuous designs such as in wallpaper, decoration and gift wrapping paper. For seamless continuous forms, it is preferred that the photosensitive element is a seamless photopolymeric sleeve.

The photopolymerizable element having a layer of particulate material thereon, is then ready for preparation for use as a flexographic printing element. The photopolymerizable element is imagewise exposed and treated to form a relief surface suitable for flexographic printing. Imagewise exposure may be through a phototool or through an in-situ mask formed by imagewise ablation of an opaque particulate layer from the element with laser radiation as disclosed in Fan in U.S. Pat. Nos. 5,888,697 and 5,888,701. Typically the ablating laser radiation is infrared. Treating of the photopolymerizable element includes (1) "wet" development wherein the photopolymerizable layer is contacted with a suitable developer solution to washout unpolymerized areas and (2) "dry" development wherein the photopolymerizable element is heated to a development temperature which causes the unpolymerized areas of the photopolymerizable layer to melt or soften or flow and is wicked away by contact with an absorbant material. Dry development may also be called thermal development. Typically the photopolymerizable element is also backflashed, i.e., exposed through the support, at the same wavelength as the main imagewise exposure. The photopolymerizable element may also be post-exposed and light finished.

Seamless cylindrical photopolymerizable elements are well-suited for mounting on conventional rotating drum mounted equipment. Thus, imagewise exposure by laser ablation or overall exposure, development and any additional process steps can be performed while the element is in cylindrical form. Conducting exposure and processing steps with a cylindrical element may provide additional advantages including elimination of cupping defect, better registration and reduced or in some cases no extra mounting time, reduced press-ready time, and increased press printing speed. In particular, the cylindrical photopolymerizable element is well-suited for mounting on conventional laser exposure equipment in which the element can be mounted directly on the drum or replace the drum (with, for example, cones supporting each end of the element) for the laser exposure step. Exposure by a laser offers additional advantages of digitally imaging the cylindrical photopolymerizable element by laser ablation of an infrared sensitive coating on the element as disclosed by Fan in U.S. Pat. No. 5,262,275, or by laser engraving of the element as disclosed by Cushner et al. in International Publications WO 93/23252 and WO 93/23253.

In addition, the continuous photopolymerizable element can be overall exposed to actinic radiation to polymerize the photopolymerizable layer, and the resulting element can be used as a thick sleeve or a sleeve with a cushion layer or as a laser engravable printing sleeve. Such a thick sleeve or cushioned element is useful for supporting another photopolymerizable layer or a relief plate in certain printing applications.

EXAMPLES

In the following examples, all percentages are by weight unless otherwise noted.

Example 1

The following example demonstrates the process of the present invention in which particulate material was applied to an exterior surface of a photopolymerizable layer on a support immediately after formation of the photopolymerizable layer.

A forming station according to the process and apparatus described in EP 1076263 A1 was used to form molten photopolymerizable material into a layer onto a support, forming a photopolymerizable printing element. An applying station, hereinafter may also be called a toning station, according to the process and apparatus described in the present specification, was appended to the end to the forming station to have an in-line applying station for the formed (or forming) photopolymerizable element to travel an axial path extended from the forming station passed the applying station and beyond. As the photopolymerizable element passed through the applying station, particulate material was applied to an exterior surface of the photopolymerizable element immediately after formation. The applying station included a dispensing hopper which was shaken at 20 Hz, a cylindrical toning pad which was agitated at 20 Hz and rotated. The cylindrical toning pad contacted the exterior surface of the photopolymerizable layer at interference of 90 mils (0.229 cm), at a nip created by the cylindrical toning pad and the photopolymerizable element. The photopolymerizable element was rotated at 35 fpm and transported axially along the mandrel (sleeve advance rate) at a rate of 10.1 linear inches per minute passed the brush of the applying station. The axis of the photopolymerizable element as parallel to the axis of the cylindrical toning pad. The axial length of the cylindrical toning pad was shorter than the axial length of the photopolymerizable element. During applying of the particulate material, the entire axial length of the photopolymerizable element passed the cylindrical toning pad so that the particulate material was applied by the pad onto and along the entire exterior surface of the photopolymerizable element, i.e., in a spiral manner. Because the photopolymerizable element was rotated and moved axially passed the rotating cylindrical toning pad, the exterior surface of the photopolymerizable layer from leading end to trailing end was contacted by the entire axial length of the cylindrical toning pad.

A photopolymerizable composition of an poly(styrene-isoprene-styrene) elastomeric binder, hexanediol diacrylate and hexanedioldimethacrylate as monomers, photoinitiator, liquid polyisoprene (molecular weight of about 29000), and other additives was extruded and calendered onto a support according to the process described in EP 1076263 A1, forming a photopolymerizable printing element. The support was a cylindrically-shaped sleeve was a CYREL® printing sleeve 15 mils (0.038 cm) thick. The photopolymerizable material formed a layer on the sleeve 70 mils (0.178 cm) thick. The freshly formed photopolymerizable element transported through the applying station as described above as the particulate material was applied. The temperature of the exterior surface of the photopolymerizable layer was monitored to be 45° C. as measured by an IR thermometer in the middle of the applying operation. The particulate material was black toner, by DuPont Company (Wilmington, Del.). The excess particulate was then wiped off with Lastic cloth. The exterior surface of the printing element was completely covered with particulate in 2.9 minutes. No problems were observed by applying the particulate while the photopolymerizable layer was still very hot from its formation while in the molten state.

Surprisingly, the resulting photopolymerizable element had a black density of 2.95 and no pinpole defect was encountered. The density of the black particulate layer was measured on a Victoreen digital densitometer, Model II 070-424 (Victoreen Inc., Cleveland Ohio). This showed a dramatic improvement, in a much shorter toning time and no pinhole defects, over that of Comparative Example 1.

The photopolymerizable element was subsequently laser imaged with a CYREL® Digital Imager (Nd:YAG laser) to imagewise remove the black particulate layer. The photopolymerizable element had excellent laser ablation sensitivity and an excellent in-situ mask performance. No print through problems were observed upon solvent processing the sleeve.

Comparative Example 1

The following example demonstrates the effect on the density of a layer particulate material on a photopolymerizable printing element when the particulate material is applied to the element after the element has been stored for an extended period of time at room temperature. This example also demonstrates the effect of time of toning, i.e., time of applying particulate material, on the density of the layer of particulate material.

Five photopolymerizable printing elements were formed according to Example 1. The photopolymerizable printing element was stored in boxes (axially, suspended with end supports) for about 4 months in a storage maintained at ambient temperature.

The photopolymerizable element was inserted axially onto a mandrel of a stand-alone (or off-line) toning station having the same parameters as described for the in-line applying station described in Example 1, In this case however, the actual length of the photopolymerizable element was shorter than the axial length of the cylindrical toning pad, and the element was not transported axially while particulate material was applied. Both the photopolymerizable element and the cylindrical toning pad were rotated. The surface temperature of the photopolymerizable element was 24–25° C. The same particulate material of Example 1 was applied. After toning, Lastic was used to wipe off the excess particulate from the surface. The toning time, i.e., the time for applying the particulate material to the exterior surface of the photopolymerizable element, was varied. The density of the black particulate layer was measured on a Victoreen densitometer as described above. The physical appearance of the particulate layer was noted. Results were as follows:

| Toning time | Toned density | Pinhole defects |
| --- | --- | --- |
| 2 minutes | 2.26 | severe pinholes |
| 4 minutes | 2.48 | severe pinholes |
| 7 minutes | 2.70 | severe pinholes |
| 10 minutes | 2.87 | severe pinholes |
| 13 minutes | 3.05 | severe pinholes |

Increased density with increased toning time was observed. However, all photopolymerizable elements had severe pinholes in the layer of particulate regardless the toning time. Pinholes in the particulate layer are not desirable, particularly for layers formed from black particulate since the black layer is used to form in-situ mask on the element and is used to block the underlying photopolymerizable layer from UV radiation in the subsequent UV imaging step. Pinholes could cause print through and undesirable specks on the floor of the processed printing element which could result in background printing on press.

Example 2

The following example demonstrates the criticality of the time between the formation of the photopolymerizable layer on a support to the application of the particulate material for the process of the present invention.

A photopolymerizable printing element was prepared according to Example 1 except the application of particulate was done on the off-line toning station as described in Comparative Example 1. There was a time delay after the photopolymerizable element was formed before the particulate material was applied to the exterior surface of the element. The particulate material was the black toner described in Example 1. The particulate was applied to the photopolymerizable element while the element and the brush rotated, but without the element moving axially, for 4 minutes with same toning parameters as in Example 1. The axial length of the photopolymerizable element was shorter than the axial length of the toning brush. The comparative printing element with about 4 months between formation and application was stored in a box at room temperature as described in Comparative Example 2. Results were as follows:

| Time Delay Between Element Formation And Application of Particulate | Exterior Surface Temperature of Photopolymerizable Layer | Density of Particulate Layer | Pinholes |
| --- | --- | --- | --- |
| 30 minutes | 31.5° C. | 2.90 | None |
| 16 hours | 22° C. | 2.57 | Almost none |
| 21 hours | 22° C. | 2.56 | Almost none |
| 4 months (comparative) | 25° C. | 2.48 | Yes and severe |

This example showed that extreme delay (4 months) between formation of the photopolymerizable element and the application of the particulate material could lead to severe pinhole defects and lower toned density in the particulate layer. This example also showed that the density and appearance of pinholes in the particulate layer are not detrimentally effected by upto at least 1 day delay between the formation of the photopolymerizable element and the application of the particulate material. This example further showed the importance of the need for "freshness" of the photopolymerizable layer when applying particulate material in order to achieve a layer of particulate that is pinhole-free.

Example 3

The following example demonstrates the criticality of the time between the formation of the photopolymerizable layer on a support to the application of the particulate material for the process of the present invention.

A photopolymerizable printing element was formed according to Example 1, except that the photopolymerizable layer was 110 mils (0.279 cm) thick. The particulate material was black toner described in Example 1. The axial length of the photopolymerizable element was shorter than the axial length of the cylindrical toning pad, so that the element did not advance axially along the length of the toning pad. Both the photopolymerizable element and the cylindrical toning pad rotated.

In the Test 1, the particulate was applied to the exterior surface of the printing element in the in-line toning station described in Example 1, substantially immediately after formation of the photopolymerizable layer. In the remaining Tests 2–5, the particulate was applied to the exterior surface of the photopolymerizable element in the off-line toning station as described in Comparative Example 1 and Example 2 with built in time delay. The samples for Tests 4 and 5 were stored in boxes between the formation of the photopolymerizable layer and the application of particulate to minimize contamination of the surface by air-borne debris. Results were as follows:

| Test | Time Delay Between Element Formation And Application of Particulate | Exterior Surface Temperature of Photopolymerizable Layer | Density of Particulate Layer | Pinholes |
|---|---|---|---|---|
| 1 | 0.5 minute (applied in-line) | 48° C. | 3.36 | None |
| 2 | 2 minute | 45.5° C. | 3.16 | None |
| 3 | 9 minute | 37° C. | 3.06 | None |
| 4 | 120 minutes | 29° C. | 2.70 | None |
| 5 | 15 days | 25° C. | 2.59 | Yes |

This example shows the unexpected importance of the "freshness" of the photopolymerizable layer when applying particulate material in order to achieve pinhole-free particulate layer. This example also shows that delay, on the order of 2 weeks, between formation of the photopolymerizable element and the application of the particulate material could lead to severe pinhole defects and lower toned density in the particulate layer.

Example 4

The following example demonstrates the process of this invention in which the exterior surface of the photopolymerizable layer of the printing element is heated just prior to or during the application of the particulate material.

Photopolymerizable printing elements without the particulate layer were prepared according to Example 1. The photopolymerizable elements were aged for about 2 months and stored in boxes at room temperature. Afterwhich, the application of the particulate material to the exterior surface of the photopolymerizable element was done in an off-line toning station as described in Comparative Example 1 except that the exterior surface of the photopolymerizable layer was heated with infrared heaters prior to toning. The photopolymerizable element was rotated during heating so that the surface was uniformly heated. The exterior surface was heated to a specific temperature prior to toning and then the particulate was applied to the printing element for 4 minutes as described in Comparative Example 1. Results were as follows:

| Surface Temperature of Photopolymer Layer | Density of Particulate Layer | Pinholes Appeared |
|---|---|---|
| 25° C. (no heat applied) | 2.29 | Yes |
| 36° C. | 2.46 | Yes |
| 46° C. | 2.80 | Yes |
| 57° C. | 3.07 | Yes |
| 71° C. | 3.60 | Yes |
| 87° C. | 3.98 | Yes |

This example showed that the density of the particulate layer on the photopolymerizable layer could be increase dramatically when the surface of the photopolymerizable layer is heated above room temperature. This results indicate that the time for applying the particulate material can be reduced by heating of the exterior surface of the photopolymerizable layer.

Desired density of the particulate layer can be achieved by altering the temperature of the photopolymerizable layer.

Example 5

The following example demonstrates the process of this invention in which the particulate material is substantially immediately applied to the photopolymerizable layer after forming the photopolymerizable element.

A photopolymerizable printing element was prepared according to Example 1, except that the photopolymerizable layer had a thickness of 110 mils (0.279 cm). The particulate material was the black toner described in Example 1. The exterior surface of the printing element was toned at the in-line toning station as described in Example 1. The time to apply the particulate layer was 3.9 minutes. The resulting density of the particulate layer was 3.36. The temperature of the exterior surface of the photopolymerizable layer was 48° C. during application.

A second photopolymerizable printing element was prepared according to Example 1, except that the photopolymerizable layer had a thickness of 30 mils (0.0762 cm). The second element was toned as described above. The time to apply the particulate layer was 0.95 minutes. The resulting density of the particulate layer was 2.45. The temperature of the exterior surface of the photopolymerizable layer was 42° C. during application.

The particulate layer for both photopolymerizable elements was free of pinholes as desired.

Example 6

The following example demonstrates the process of this invention in which a "fresh" photopolymerizable layer provides higher density of particulate layer on the photopolymerizable element compared to an "aged" photopolymerizable layer which is heated before applying the particulate material.

A photopolymerizable printing element was prepared and toned as described in Example 1. The thickness of the photopolymerizable layer was 110 mils (0.279 cm). The time to apply the particulate layer was 3.9 minutes. The temperature of the exterior surface of the photopolymerizable layer was 48° C. during application. The resulting density of the particulate layer was 3.36. No pinholes in the particulate layer were observed.

A second photopolymerizable printing element was prepared and toned as described in Example 2. The thickness of the photopolymerizable layer was 105 mils (0.267 cm). The printing sleeve was aged in a box at room temperature for about 2 months. The time to apply the particulate layer was 4 minutes. The temperature of the exterior surface of the photopolymerizable layer was 48° C. during application. The resulting density of the particulate layer was 2.90. Pinholes in the particulate layer were observed.

This example showed that higher density can be attained by applying the particulate material while the photopolymerizable layer is freshly formed. The example also showed that the results of the "fresh" photopolymerizable layer cannot be attained by subsequently heating an "aged" photopolymerizable layer to an equivalent (fresh) surface temperature just prior to or during application of the particulate material. The "aged" printing element that was heated during particulate application had lower density of particulate layer and pinholes compared to the particulate layer for the "fresh" printing element.

What is claimed is:

1. An apparatus for applying particulate material on a photopolymerizable element useful as a flexographic printing plate comprising:

means for forming a layer of a molten photopolymerizable material onto a support;

means for applying particulate material onto an exterior surface of the photopolymerizable layer opposite the support; and means for providing relative movement between the layer of photopolymerizable material and the means for applying particulate material, wherein the exterior surface of the photopolymerizable layer has area portions each of which experience the same or substantially the same particulate application conditions.

2. The apparatus of claim 1 wherein the means for applying particulate material comprises an application assembly comprising:

an applicator pad having surface portions for contacting the particulate material to the exterior surface of the photopolymerizable layer so that each of the area portions of the exterior surface experience the same or substantially the same particulate application conditions by contacting all or substantially all of the surface portions of the pad.

3. The apparatus of claim 2 wherein the applicator pad is cylindrically-shaped.

4. The apparatus of claim 3 wherein the application assembly further comprises:

means for rotating, oscillating, or both rotating and oscillating the applicator pad.

5. The apparatus of claim 2 wherein the application assembly further comprises:

a dispensing assembly for supplying and dispensing the particulate material to the applicator pad.

6. The apparatus of claim 1 wherein the support is a cylindrically-shaped sleeve.

7. The apparatus of claim 5 further comprising means for rotating the sleeve.

8. The apparatus of claim 1, wherein the support is a cylindrically-shaped sleeve having an axial length and the means for applying the particulate material comprises an application assembly comprising an application pad having an axial length that is shorter than the axial length of the support.

9. The apparatus of claim 1 wherein the support is a cylindrically-shaped sleeve having an axial length and the means for applying the particulate material comprises an application assembly comprising an application pad having an axial length that is equal to or longer than the axial length of the support.

10. The apparatus of claim 1, further comprising:

means for altering the temperature of the exterior surface of the photopolymerizable layer.

11. The apparatus of claim 10 wherein the means for altering the temperature is by heating and is selected from the group of conduction, convection, radiation, or combinations thereof.

12. The apparatus of claim 10 wherein the means for altering the temperature is by cooling.

13. The apparatus of claim 1 further comprising:

means for altering temperature of the photopolymerizable layer by heating or cooling the support side of the layer.

14. The apparatus of claim 1 wherein the support is a cylindrically-shaped sleeve having a longitudinal axis and the means for forming a layer of photopolymerizable material comprises:

supplying a substantially molten stream of the photopolymerizable material onto the sleeve;

providing relative axial movement between the sleeve and the supply of photopolymerizable material along the longitudinal axis of the sleeve;

calendering the molten photopolymerizable material on the sleeve by metering with at least one rotating calender roll the photopolymerizable material to have a substantially constant thickness on the sleeve and rotating the sleeve to polish an outer circumferential surface of the material to a seamless uniform state, thereby forming a seamless photopolymerizable layer on the sleeve.

15. The apparatus of claim 1, wherein the forming means further comprises:

an extruder station for providing the photopolymerizable material in a molten state onto the support; and a calender assembly comprising at least one calendering roll for metering the molten photopolymerizable material to form the layer on the support and polish the exterior surface of the layer.

16. The apparatus of claim 1, further comprising:

an assembly for loading the support on to a mandrel and unloading the photopolymerizable element from the mandrel.

17. The apparatus of claim 1 further comprising:

a loading assembly for loading the support onto a mandrel; and an unloading assembly for unloading the photopolymerizable element from the mandrel.

18. An apparatus for applying particulate material on a photopolymerizable element useful as a flexographic printing plate comprising:

means for mounting the photopolymerizable element having a layer of photopolymerizable material on a support;

means for applying the particulate material onto an exterior surface of the photopolymerizable layer opposite the support; and means for providing relative movement between the photopolymerizable layer and the means for applying the particulate material, wherein the exterior surface of the photopolymerizable layer has area portions each of which experience the same or substantially the same particulate application conditions.

19. The apparatus of claim 18, wherein the means for applying particulate material comprises an application assembly comprising:

an applicator pad having surface portions for contacting the particulate material to the exterior surface of the photopolymerizable layer so that each of the area portions of the exterior surface experience the same or substantially the same particulate application conditions by contacting all or substantially all of the surface portions of the pad.

20. The apparatus of claim 19, wherein the applicator pad is cylindrically-shaped.

21. The apparatus of claim 19, wherein the application assembly further comprises:

means for rotating, oscillating, or both rotating and oscillating the applicator pad.

22. The apparatus of claim 19, wherein the application assembly further comprises:

a dispensing assembly for supplying and dispensing the particulate material to the applicator pad.

23. The apparatus of claim 18, wherein the support is a cylindrically-shaped sleeve.

24. The apparatus of claim 18, further comprising:

means for altering the temperature of the exterior surface of the photopolymerizable layer.

25. The apparatus of claim 24, wherein the means for altering the temperature is by heating the exterior surface to at least 30° C. and is selected from the group of conduction, convection, radiation, or combinations thereof.

26. The apparatus of claim 24, wherein the means for altering the temperature is by cooling.

27. The apparatus of claim 18, wherein the support is a cylindrically-shaped sleeve and further comprises means for rotating the sleeve.

28. The apparatus of claim 27, wherein the sleeve can be rotated at the same or different rotational speed of the applicator pad.

29. An apparatus for applying particulate material on a photopolymerizable element useful as a flexographic printing plate comprising:

means for mounting the photopolymerizable element having a layer of photopolymerizable material on a cylindrical support;

means for applying the particulate material onto an exterior surface of the photopolymerizable layer opposite the support, wherein the means for applying comprises an applicator assembly having a cylindrical applicator pad; and means for heating the exterior surface of the photopolymerizable layer.

\* \* \* \* \*